(12) United States Patent
Ranger et al.

(10) Patent No.: US 6,615,975 B2
(45) Date of Patent: Sep. 9, 2003

(54) MAGNETIC COUPLING ASSEMBLY FOR CONVEYOR ROLLERS

(75) Inventors: Michel Ranger, Lachine (CA); Marc Zweili, Roxboro (CA)

(73) Assignee: GEBO Convoyeurs Consultants & Systems Inc., Laval (CA)

( * ) Notice: Subject to any disclaimer, the term of this patent is extended or adjusted under 35 U.S.C. 154(b) by 0 days.

(21) Appl. No.: 09/915,316

(22) Filed: Jul. 27, 2001

(65) Prior Publication Data

US 2003/0019724 A1 Jan. 30, 2003

(51) Int. Cl.[7] ................................................ B65G 13/06

(52) U.S. Cl. ................................................ 198/781.08

(58) Field of Search ....................... 198/781.04, 781.06, 198/781.08

(56) References Cited

U.S. PATENT DOCUMENTS 3,610,406 A * 10/1971 Fleischauer et al. ... 198/781.04

* cited by examiner

Primary Examiner—Joseph E. Valenza

(57) ABSTRACT

A magnetic coupling assembly for selectively rotating rollers of a roller conveyor when the torque required to maintain this rotation does not exceed a predetermined threshold is described herein. The magnetic coupling is mounted to the side rail of a conveyor, below the conveyor rollers and include a driving portion rotatably mounted to the side rail and a driven portion rotatably mounted to the driving portion. Corresponding friction surfaces of the driving and driven portion are brought and maintained in contact via a magnet and an element made of magnetic material or another magnet. Means for varying the distance between the magnet and the element made of magnetic material are disclosed. The present invention is also concerned with means for simultaneously adjusting more than one coupling assembly and with means for detecting the rotation of conveyor rollers.

14 Claims, 8 Drawing Sheets

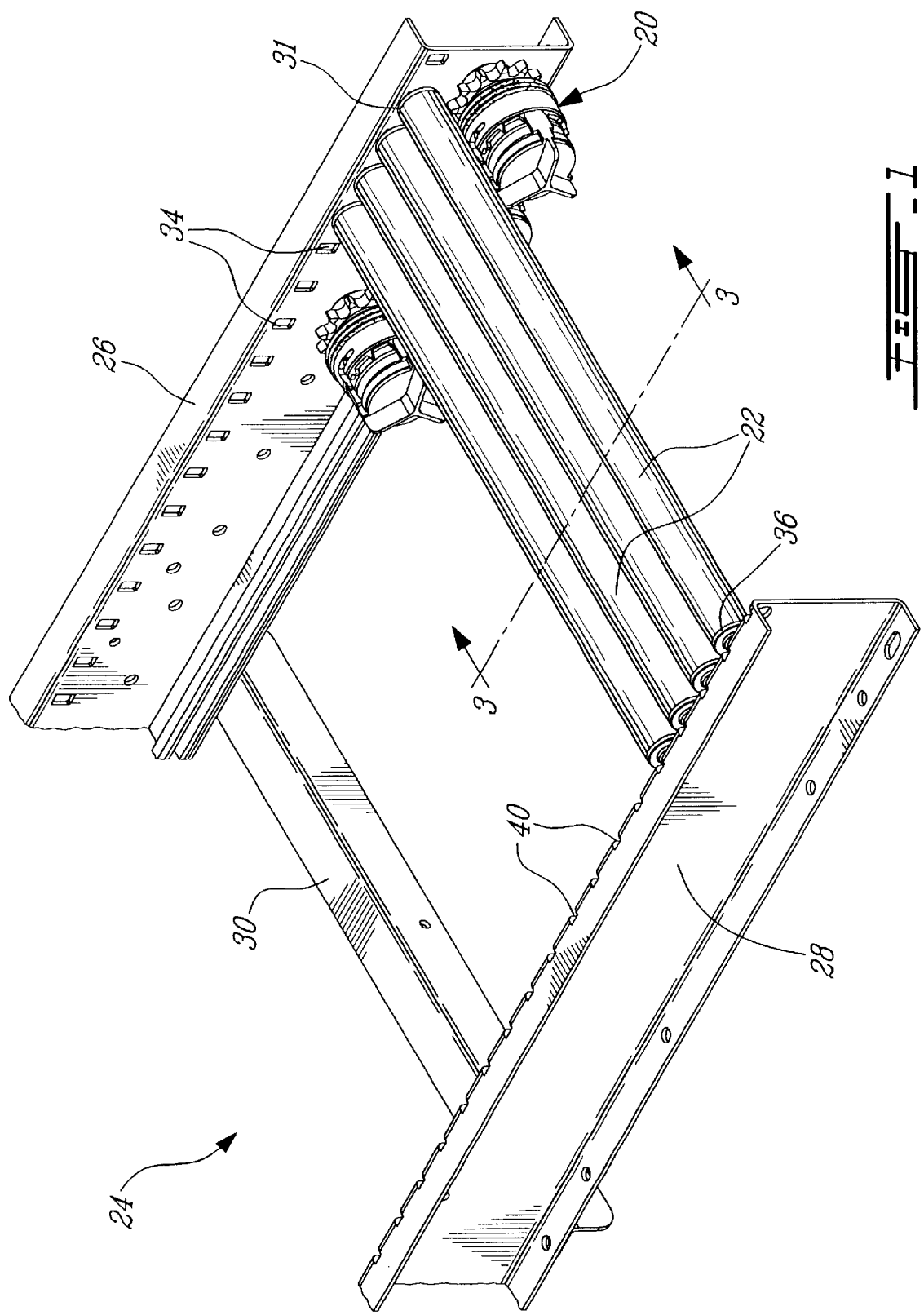

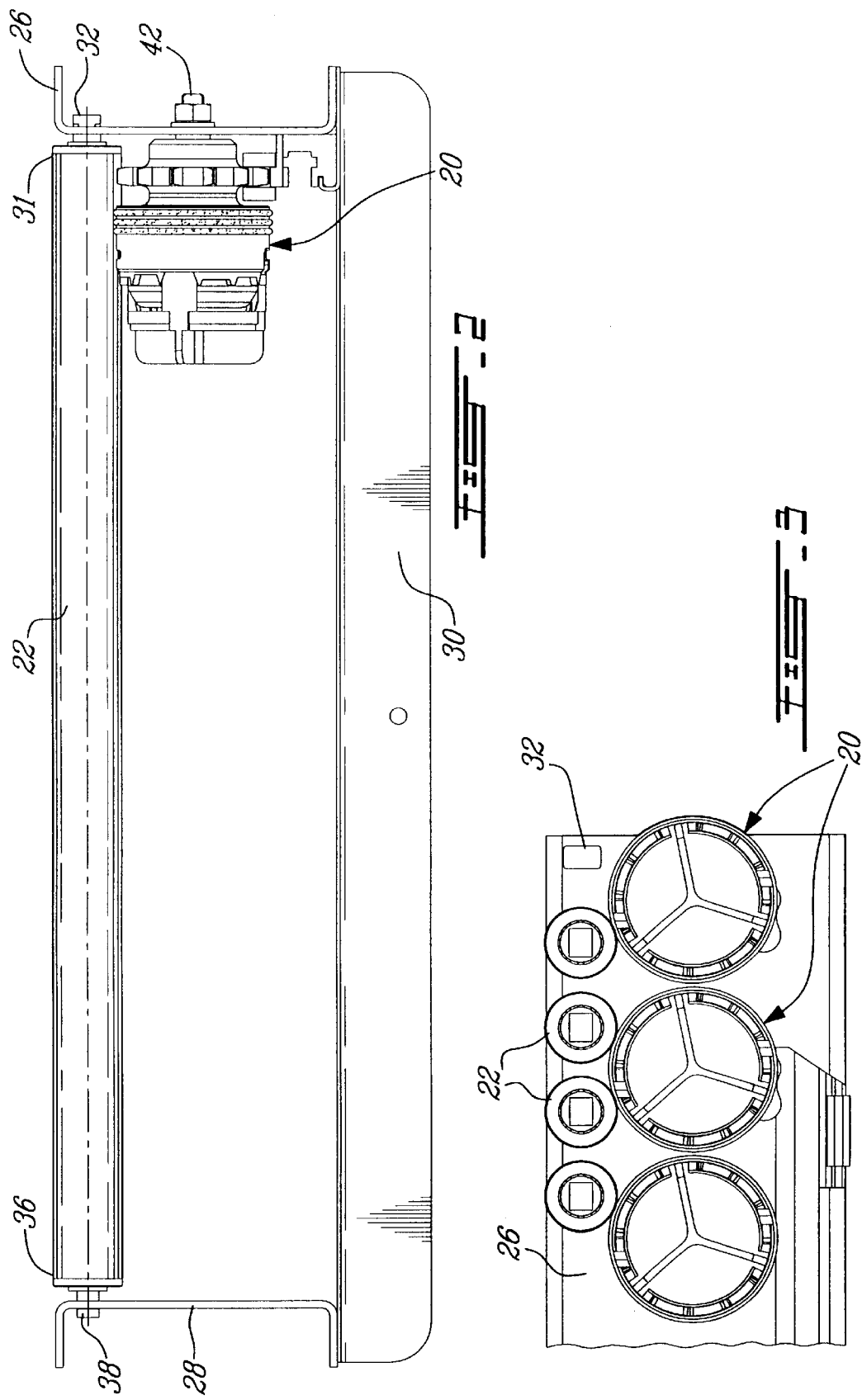

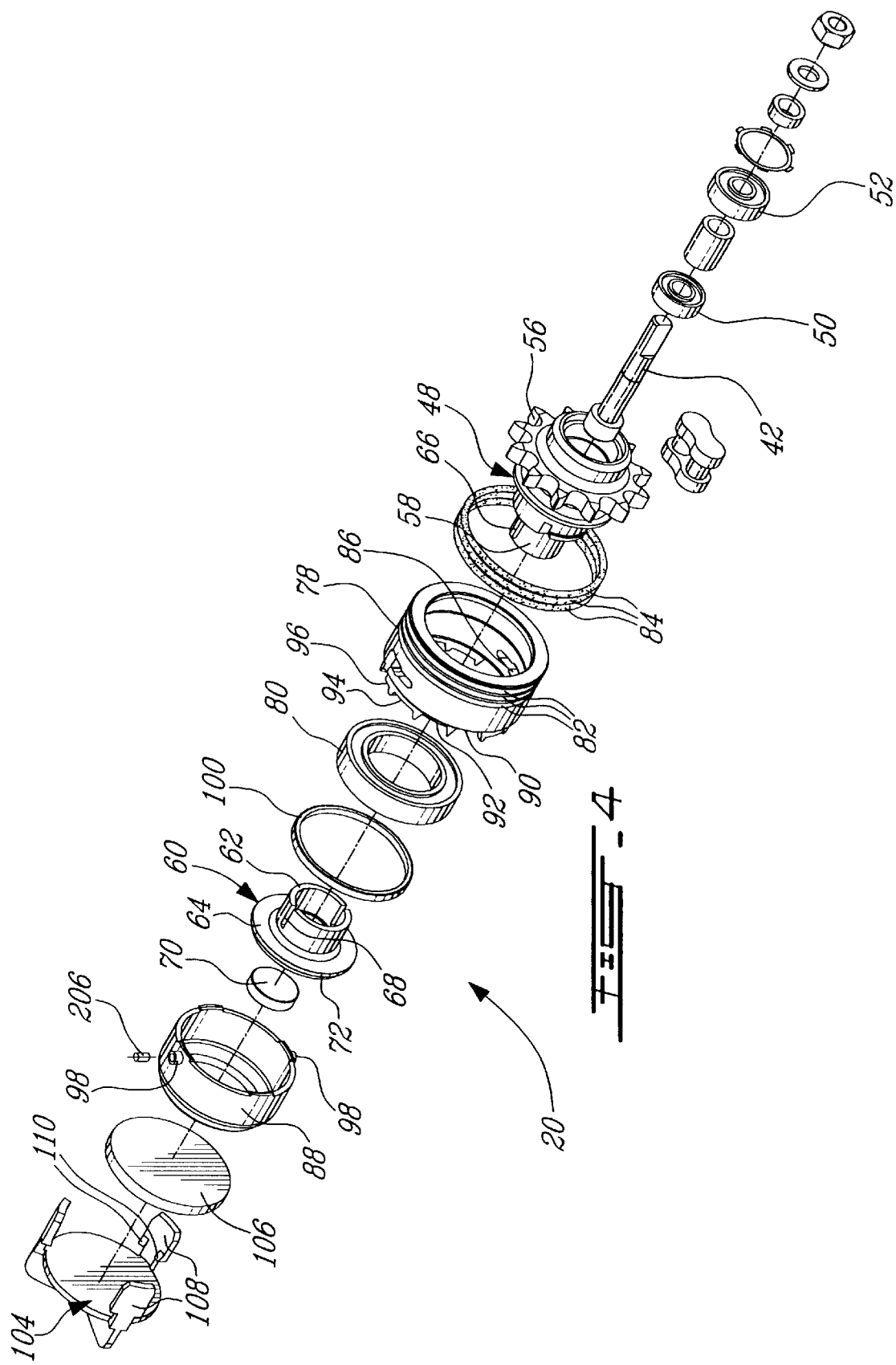

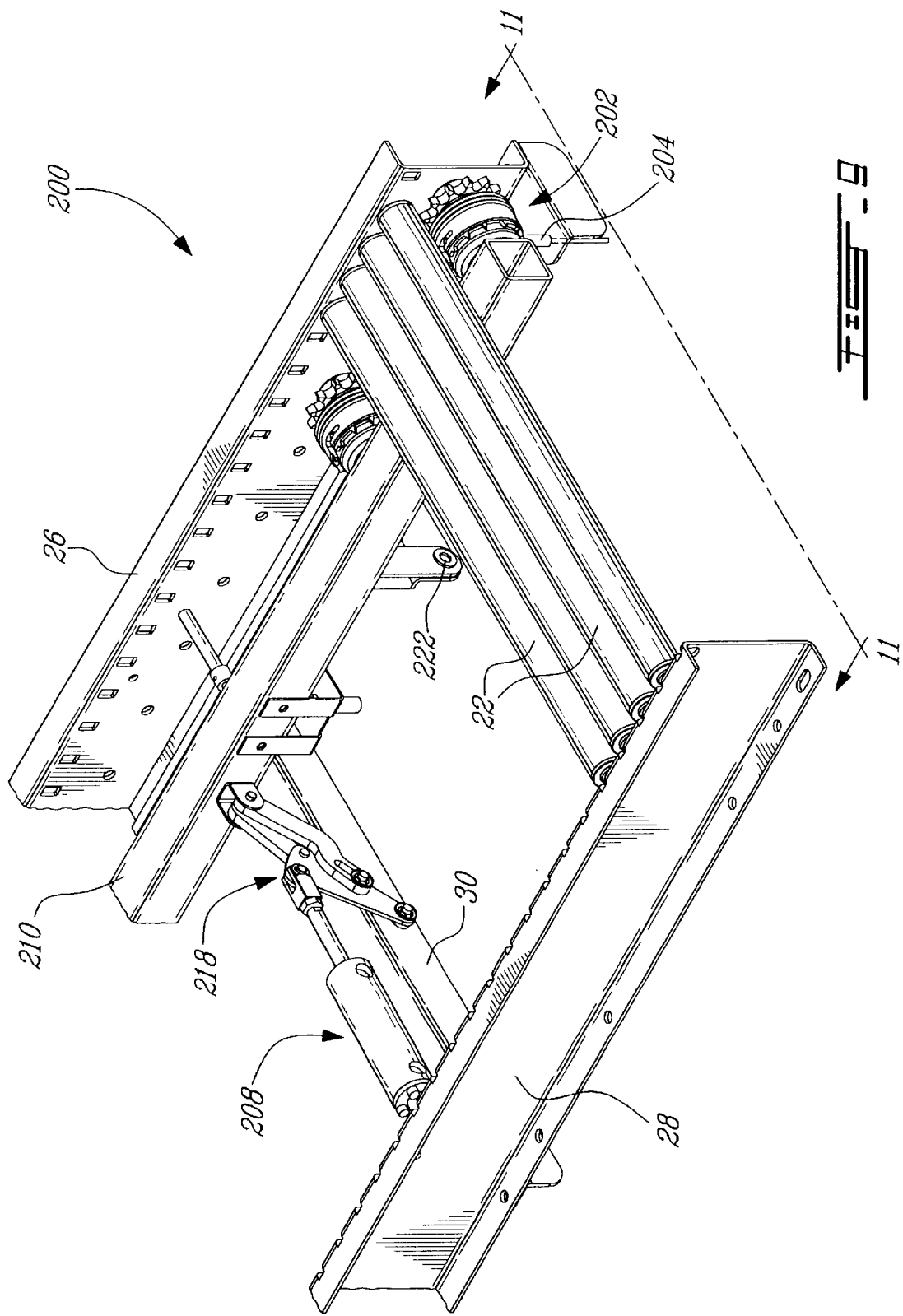

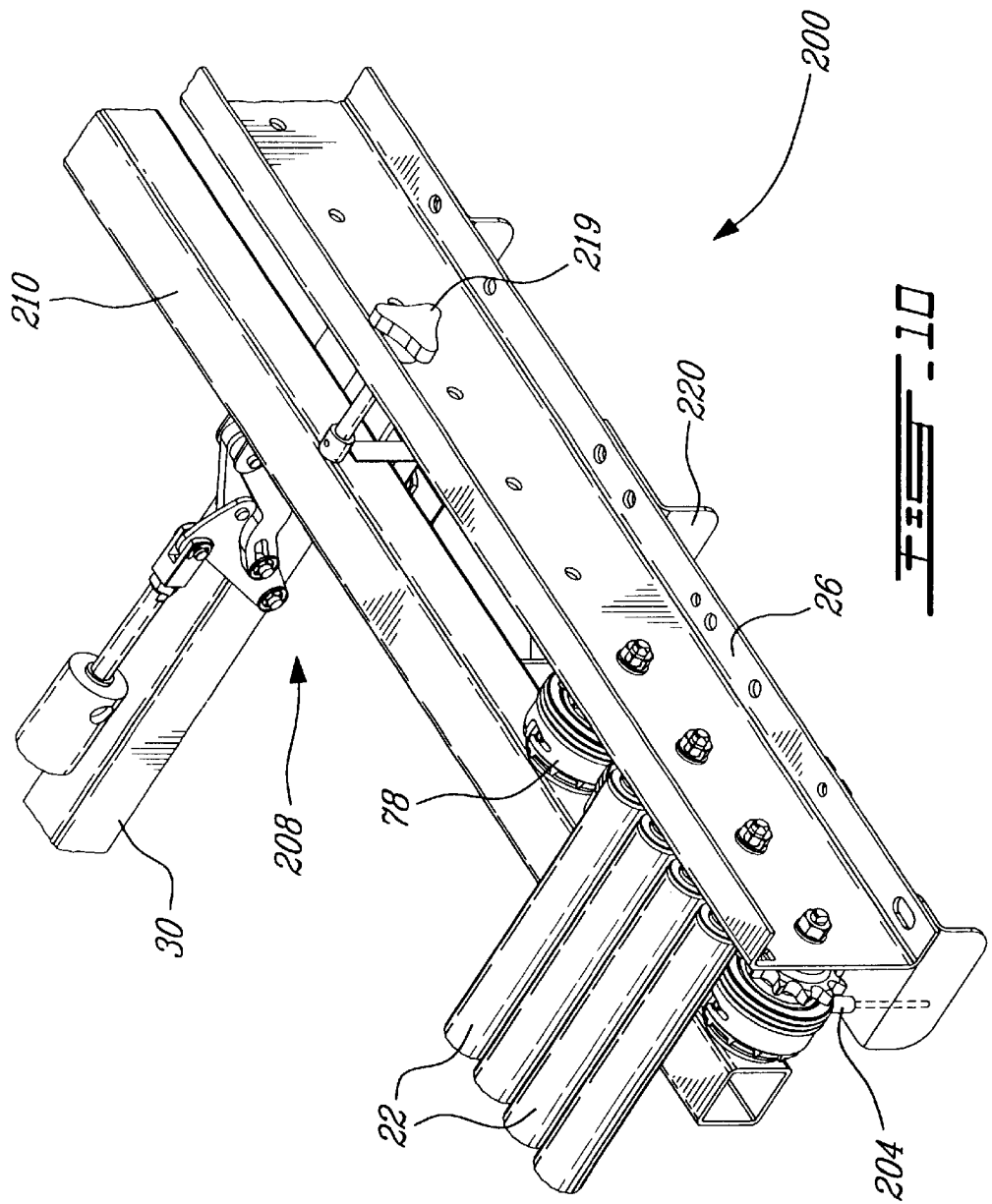

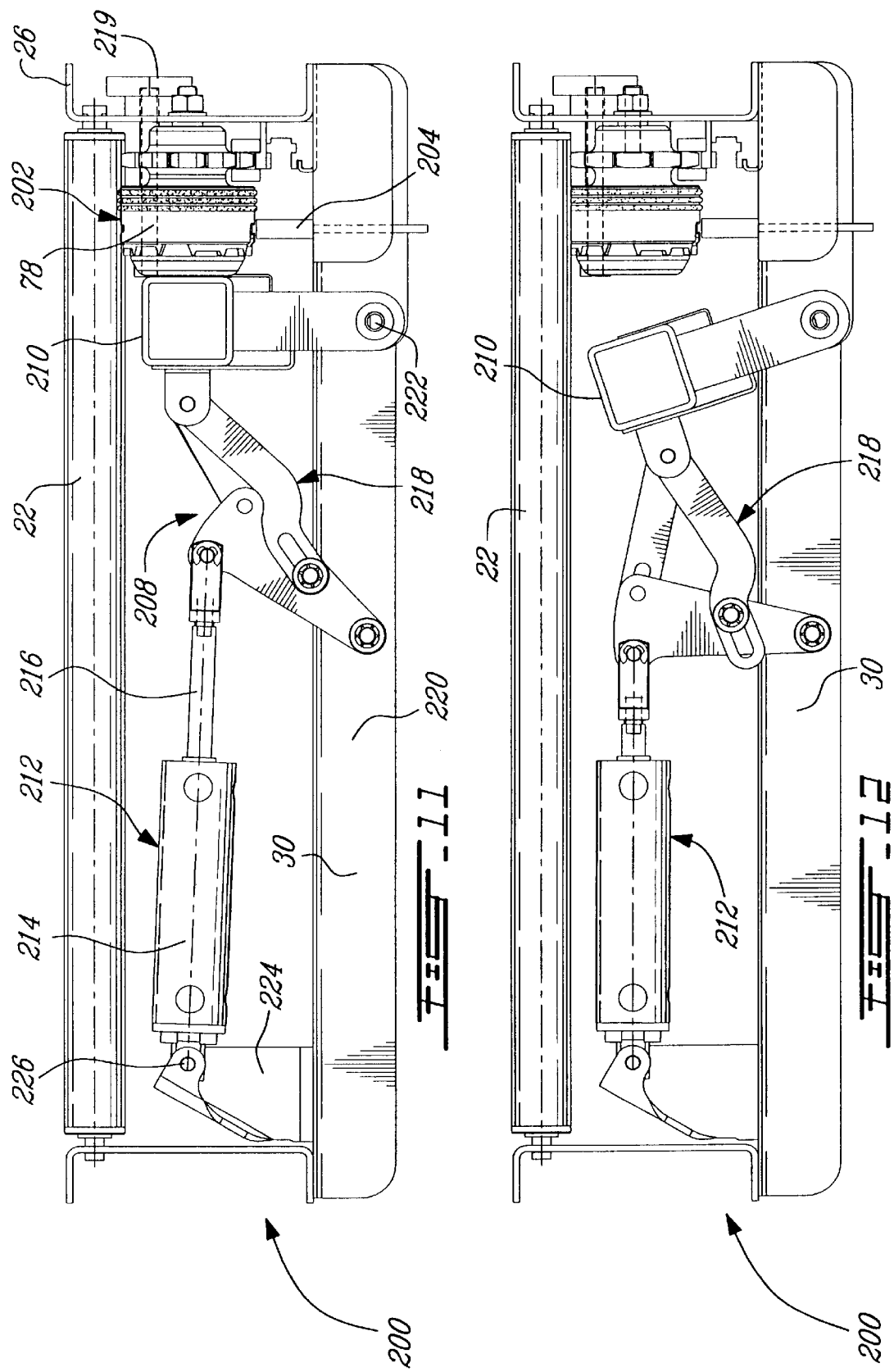

MAGNETIC COUPLING ASSEMBLY FOR CONVEYOR ROLLERS

FIELD OF THE INVENTION

The present invention relates to an assembly to drive conveyor rollers. More specifically, the present invention is concerned with such a coupling assembly provided with a magnetic clutch device.

BACKGROUND OF THE INVENTION

Conveyor systems provided with power driven rollers are well known in the art. They are generally used to move objects to and from various locations following a predetermined path.

Means for engaging and disengaging coupling assemblies from conveyor rollers are also well known in the art since it is often necessary to stop the conveyor rollers when the accumulation of the objects moved by the conveyor occurs to prevent the objects, the conveyor driving mechanism and/or the conveyor rollers from being damaged should the conveyor be continuously powered under these conditions.

One method used for stopping powered conveyor rollers is to provide slip clutches thereon for the purpose of achieving slippage between driving and driven components when the torque required to move the objects reaches a predetermined level. Of course, the rotation of the driven portion generally resumes once there is no more immobilization.

Example of such slippage clutch arrangements includes the use of a series of friction disks pressed axially together by force applied by spring or magnetic forces.

An example of a magnetic type of coupling assembly for driving a conveyor roller is described in U.S. Pat. No. 4,469,220 issued Sep. 4, 1984, naming Lynn T. Becker et al. as inventors and entitled "Magnetic coupling assembly for accumulating power roll conveyor". The system described by Becker automatically disengages the conveyor roller from the coupling assembly when an accumulation of the objects being moved by the conveyor occurs. Becker's system has many drawbacks. For example, since the coupling assembly is in line with the conveyor roller, maintenance is more difficult. Furthermore, the adjustment must be done manually on each roller and, since the adjustment is done via a continuous thread, it may prove difficult to adjust the same air gap on each roller.

Another example of a driving conveyor roller is described in U.S. Pat. No. 4,063,636 issued Dec. 20, 1977, naming vom Stein as the inventor and entitled: "Disconnectable driving roller for roller conveyors". This disconnectable driving roller has individual driving roller groups isolated from a common conveyor drive. This is an improvement over Becker's system since more than one conveyor roller may be disconnected simultaneously. This system is however relatively mechanically complex and therefore more costly to manufacture and to maintain.

Another aspect also known for conveyor systems are means for detecting movements, gaps or presence of conveyed objects on the conveyor. Such existing devices include, photosensor, induction sensor and optical sensor, for example. Any detected anomaly by these sensors is supplied to the conveyor system for further action.

It is therefore only possible to detect gaps between objects on a conveyor system with such a sensor. However, it appears to be difficult, when no gap is detected, to determine if the objects are so close together that there is no gap while the conveyor is moving or if the conveyor is stopped.

SUMMARY OF THE INVENTION

More specifically, in accordance with the present invention, there is provided a magnetic coupling assembly to selectively couple a drive element of a longitudinal conveyor to at least one conveyor roller; the coupling assembly comprising:

a driving portion configured and sized to be mounted to the conveyor; the driving portion being so configured as to be rotatably driven about a rotation axis by the drive element of the conveyor;

a driven portion so linked to the driving portion as to rotate about the rotation axis; the driven portion including an external surface configured and sized to be brought in contact with at least one conveyor roller;

an axially movable element mounted to one of the driving and driven portions; the axially movable element being provided with a first friction surface; the other of the driving and driven portions including a second friction surface facing the first friction surface;

wherein one of the axially movable element and the other of the driving and driven portions is provided with a magnetic field generating element; the other of the axially movable element and the other of the driving and driven portions being provided with an element made of magnetic material;

whereby the first and second friction surfaces are brought in contact by a magnetic force present between the magnetic field generating element and the element made of magnetic material.

According to another aspect of the present invention, there is provided a conveyor section configured to be part of a conveyor providing with a drive element, the conveyor section comprising:

first and second laterally spaced apart longitudinal side rails;

a plurality of conveyor rollers mounted to the first and second side rails;

at least two coupling assemblies mounted to the first side rail; each coupling assembly including:
 a driving portion configured and sized to be mounted to the first side rail; the driving portion being so configured as to be rotatably driven about a rotation axis by the drive element of the conveyor;
 a driven portion so linked to the driving portion as to rotate about the rotation axis; the driven portion including an external surface configured and sized to be brought in contact with at least one conveyor roller;
 an axially movable element mounted to one of the driving and driven portions; the axially movable element being provided with a first friction surface; the other of the driving and driven portions including a second friction surface facing the first friction surface;
 a longitudinal element so mounted to the first side rail as to reciprocate between an engaged position where it is close to the coupling assemblies and a disengaged position where it is distant from the coupling assemblies;
 wherein one of the axially movable element and the longitudinal element is provided with a magnetic field generating element and the other of the axially movable element and the longitudinal element is provided with an element made of magnetic material;

whereby the first and second friction surfaces are brought in contact by a magnetic force present between the magnetic field generating element and the element made of magnetic material.

According to a third aspect of the present invention, there is provided a detecting assembly for a conveyor provided with at least one coupling assembly mounted to a side rail and coupling a drive assembly to rollers of the conveyor; the coupling assemblies including a driving portion mounted to a side rail and a driven portion linked to the driving portion; the detecting assembly comprising:

a detectable element mounted to the driven portion;

a sensor so mounted to the conveyor as to detect the movement of the detectable element to determine the rotation of the driven portion and of the rollers.

Other objects, advantages and features of the present invention will become more apparent upon reading of the following non restrictive description of preferred embodiments thereof, given by way of example only with reference to the accompanying drawings.

BRIEF DESCRIPTION OF THE DRAWINGS

In the appended drawings:

FIG. 1 is a perspective view of a conveyor provided with multiple conveyor rollers mounted to magnetic coupling assemblies according to a first embodiment of the present invention;

FIG. 2 is a front elevational view the conveyor of FIG. 1;

FIG. 3 is a cross-sectional view taken along line 3—3 of FIG. 1;

FIG. 4 is an exploded perspective view of a magnetic coupling assembly according to a first embodiment of the present invention;

FIG. 9 is a perspective view of a conveyor provided with rollers mounted to magnetic couplings assemblies according to a second embodiment of the present invention;

FIG. 10 is a perspective view of the opposite side of FIG. 9;

FIG. 11 is a front elevational view of one of the conveyor of FIG. 9; and

FIG. 12, is a front elevational view similar to FIG. 11 but illustrating the adjustment bar in a disengaged position.

DESCRIPTION OF THE PREFERRED EMBODIMENT

Figure 5:
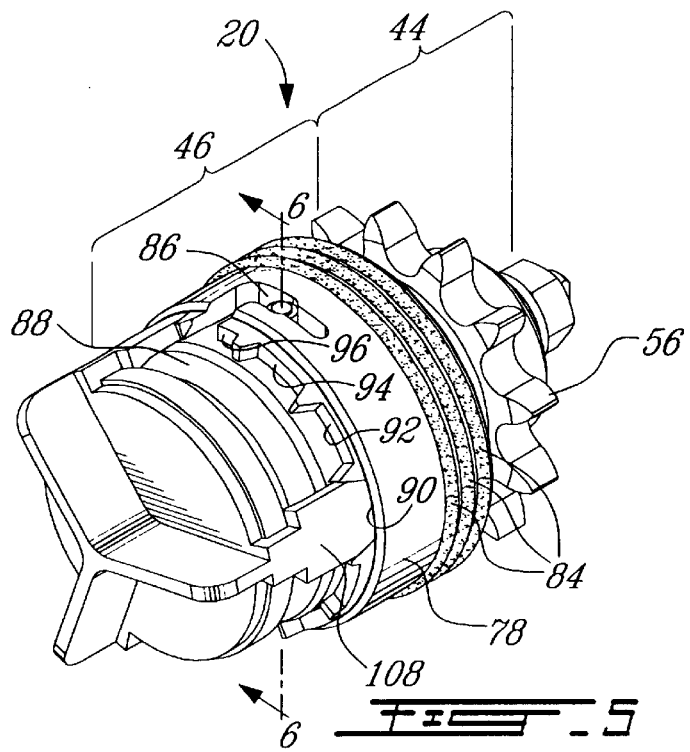
FIG. 5 is a perspective view of the magnetic coupling assembly of FIG. 4, shown in a first adjustable position.

Turning now to FIGS. 1 to 8 of the appended drawings, a magnetic coupling assembly 20, according to a first embodiment of the present invention, will now be described. The magnetic coupling assembly 20 is used to drive the rollers 22 of a roller conveyor 24 into rotation.

As it can be seen from FIG. 1, the roller conveyor 24 includes a pair of spaced sides rails 26, 28 maintained in a predetermined spaced relationship by braces 30 (only one shown). Magnetic coupling assemblies 20 are inwardly mounted onto the first side rail 26. A plurality of conveyor rollers 22 are horizontally mounted to the two opposite side rails 26 and 28. More specifically, each conveyor roller 22 is provided with a first end 31 that includes a pin 32 (see FIG. 2) that may be engaged in any of the corresponding rectangular apertures 34 of the side rail 26. Similarly, each conveyor roller 22 is provided with a second end 36 that includes a pin 38 (see FIG. 2) that may be engaged in any of the corresponding apertures 40 of the side rail 28. However, as can be better seen from FIG. 1, the top portion of the apertures 40 is not closed, thereby allowing the easy removal of the conveyor rollers 22 by a lifting motion of the second end 36 thereof.

As mentioned hereinbefore, each magnetic coupling assembly 20 is inwardly mounted by means of a bolt 42 to the side rail 26. As can bee seen from FIG. 3, each coupling assembly 20 may be used to support two conveyor rollers 22. As will easily be understood by one skilled in the art, the rectangular apertures 32 allow the conveyor rollers 22 to be vertically moved to allow a good contact on the coupling assemblies 20 as will be discussed hereinbelow.

One skilled in the art will understand that the general purpose of the magnetic coupling assembly of the present invention is to selectively bring the conveyor rollers in rotation when the torque required to do so does not exceed a predetermined adjustable limit.

Turning now to FIGS. 4 to 8, the structure of the magnetic coupling assembly will be described.

Basically, the coupling assembly 20 includes a driving portion 44 and a driven portion 46. The driving portion 44 is rotatably mounted to the rail 26 and the driven portion 46 is rotatably mounted to the driving portion 44.

Figure 6:
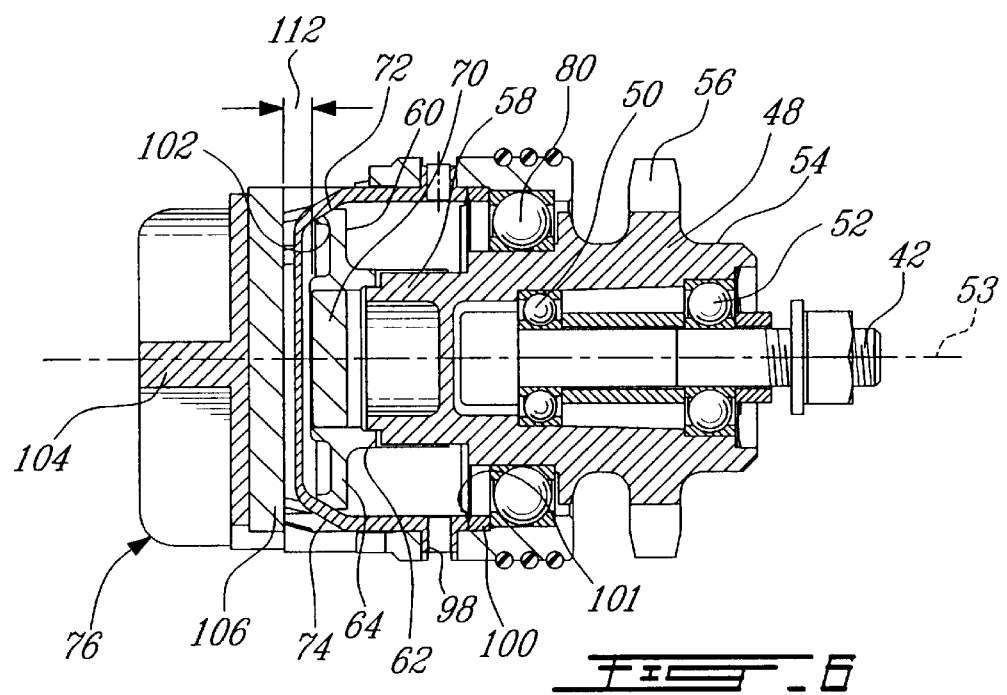
FIG. 6 is a cross-sectional view taken along line 6—6 of FIG. 5.

More specifically, as can be better seen from FIG. 6, the driving portion 44 includes a body 48 so mounted to the bolt 42 via a pair of bearings 50, 52 as to be rotatable about a rotatation axis 53. The proximate end 54 of the body 48 includes a sprocket 56 and the distal end 58 is generally cylindrical.

The driving portion also includes an axially movable element 60 provided with a tubular portion 62 and a generally flat portion 64. The tubular portion 62 is so sized as to be slidable on the generally cylindrical distal end portion 58 of the body 48. As can be noted from FIG. 4, the distal end portion 58 of the body 48 includes ridges 66 (only one shown) and the tubular portion 62 of the movable element 60 includes corresponding channels 68 allowing the element 60 to slide onto the distal end 58 while rotating therewith.

One of ordinary skills in the art will understand that the tubular portion 62 and the distal end portion 58 do not need to be cylindrical, as long as these two portions are so configured and sized as to allow the axially movable element 60 to slide onto the distal end 58 while rotating therewith. For example, the corresponding cross-sectional profiles of these two elements could be octogonal.

Returning to FIG. 6, the axially movable element 60 also includes a magnetic field generating element embodied by a permanent magnet 70, the purpose of which will be described hereinbelow, and a first peripheral angled friction surface 72.

In the preferred embodiment shown herein, the driven portion 46 may be divided into two parts: a covering part 74 and an adjustment part 76.

The cover part 74 includes a conveyor roller contacting member 78 that is so mounted to the body 48 of the driving portion 44 via a bearing 80 as to be rotatable about the rotation axis 53. The roller contacting member 78 includes three circumferential grooves 82 adapted to receive O-rings 84 that will frictionally engage the conveyor rollers as will be described hereinbelow. Of course, the O-rings 84 could be replaced by other frictional means to ensure adequate friction between the roller contacting member 78 and the rollers 22.

As can be better seen from FIG. 5, the roller contacting member 78 also includes two L-shaped channels 86 (only one shown) used to retain a cover member 88 as will be described hereinafter. Furthermore, the roller contacting member 78 also includes three sets of four U-shaped indentations 90, 92, 94 and 96, used for the adjustment of the slippage torque as will be described hereinbelow.

The cover member 88 may include opposite pins 98 configured and sized to enter the L-shaped channels 86 of the roller contacting member 78 to thereby releasably mount the cover member 88 thereto. A spacer 100 is provided between the cover 88 and the contacting member 78. The cover member 88 includes a second angled friction surface 102 facing the first angled friction surface 72 when the cover member 88 is mounted to the roller contacting member 78.

One skilled in the art will understand that there are other arrangements possible to allow the first friction surface 72 and the second friction surface 102 to face each other without having the driven portion 46 covering the driving portion 44. Indeed, while this covering is advantageous in some cases since it prevents infiltration of water and other debris between the two friction surfaces, it is not a requirement of the present invention. For example, the driving and driven portions could be mounted side by side on a common shaft (not shown) with their respective friction surfaces facing each other. In this way, the driven portion would be linked to the driving portion without being mounted thereto.

One skilled in the art will also understand that the angled configuration of the friction surfaces 72 and 102 is not a requirement of the present invention.

The adjustment part 76 includes a support 104 and a disk made of magnetic material 106. The support 104 includes three legs 108 provided with tabs 110 allowing the disk 106 to be mounted thereto. The ends of the legs 108 are so shaped as to correspond to the U-shaped indentations 90–96.

FIGS. 5 and 6 illustrate the coupling assembly in a first position where the legs 108 of the adjustment part 76 are inserted in the indentations 90 of the contacting member 78. As can be better seen from FIG. 6, when this is the case, the disk 106 is at its closest position from the magnet 70 (see arrow 112).

Figure 7:
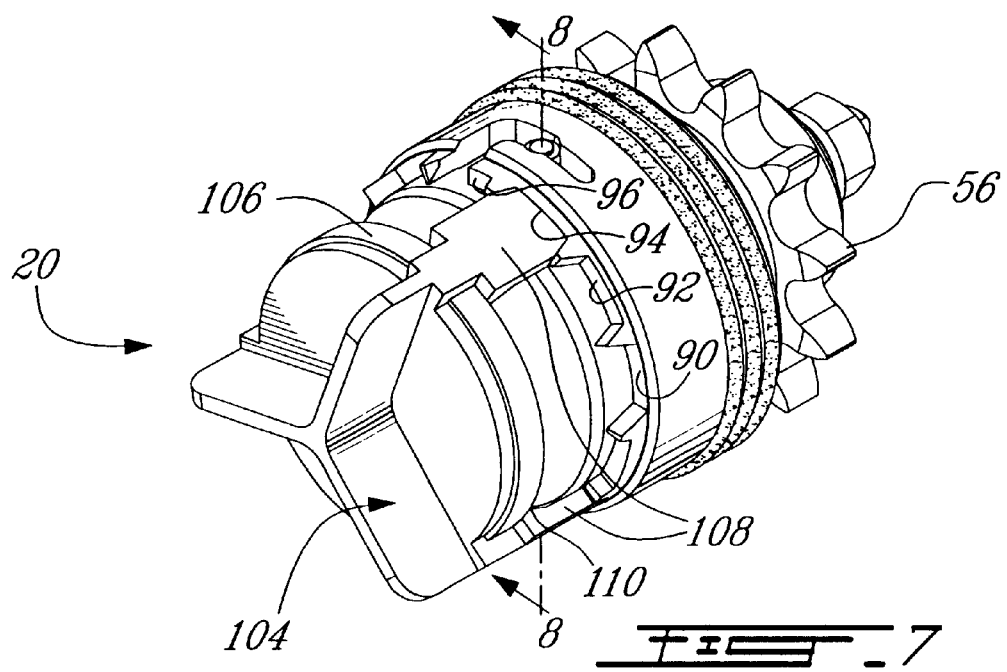
FIG. 7 is a perspective view of the magnetic coupling assembly of FIG. 4 when the cap is rotatably moved to a second adjustable position.
Figure 8:
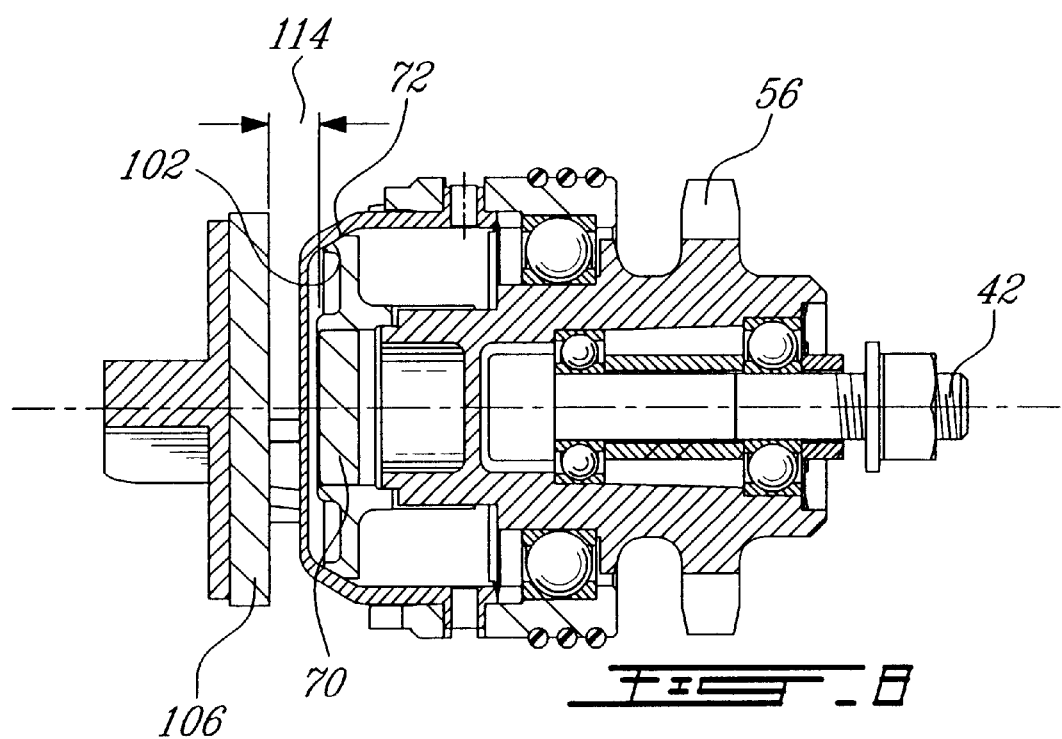
FIG. 8 is a cross-sectional view taken along line 8—8 of FIG. 7.

Conversely, in FIGS. 7 and 8, the coupling assembly is in a second position where the legs 108 are inserted in the indentations 94 of the contacting member 78. This is an intermediate position where the disk 106 is relatively far from the magnet 70 (see arrow 114).

It is to be noted that since there are four different depth indentations in each set, there are four possible positions of the adjustment part 76 with respect to the rest of the coupling assembly 20. The remaining two positions have not been illustrated for concision purposes. It is also to be noted that the number of possible positions and the corresponding distances between the disk 106 and the magnet 70 have been given as an illustrative example only. Furthermore, other means for maintaining the disk 106 at predetermined distances from the magnet 70 may also be contemplated without departing from the scope of the present invention.

In operation, the coupling assemblies 20 are mounted to the side rail 26 via their respective bolts 42, as illustrated in FIGS. 1 and 2, and two rollers 22 are put into contact with each coupling 20 (FIG. 3). More specifically the rollers rest on the O-rings 84, which are advantageously made of rubber material, to thereby provide adequate friction between the coupling 20 and the rollers 22.

A driving chain (not shown) engages the sprocket 56 of the coupling to thereby bring it in rotation upon activation of an electric motor (not shown).

Since the element 60 is axially free to move on the body 48, if the adjustment part 76 is not secured to the coupling assembly 20, rotation of the body 48 via the sprocket 56 will not cause the roller contacting member 78 to rotate since no force is present to cause the contact between the first and second friction surfaces 72 and 102. Indeed, as will easily be understood by one skilled in the art, the only contact between the driving and driven portions 44 and 46 susceptible to bring the driven portion in rotation is the frictional contact between the two friction surfaces 72 and 102. To create this friction force, the contact between the two friction surfaces must be maintained. The magnetic attraction between the magnet 70 and the disk 106 maintains this contact between the friction surfaces.

Of course, when the adjustment part 76 is in the position illustrated in FIGS. 5 and 6, the friction force between the friction surfaces 72 and 102 is greater than when the adjustment part 76 is in the position illustrated in FIGS. 7 and 8, since the magnetic force between the magnet 70 and the disk 106 is greater.

Therefore, when the adjustment part is mounted to the roller contacting element 78, rotation of the sprocket 56 will bring the roller contacting part 78, hence the rollers 22 supported thereby, in rotation as long as the force required to rotate the rollers 22 is not greater than the friction force between the friction surfaces 72 and 102.

Consequently, if accumulation of objects positioned onto the rollers 22 of the conveyor 20 occurs, the required force to rotate the rollers 22 will increase and become greater than the friction force between the friction surfaces 72 and 102. This will cause slippage between these friction surfaces which disengages the rollers 22 from the driving portion 44. The rollers 22 are therefore selectively coupled to a drive element, i.e. the chain (not shown) via the coupling assembly 20.

It is finally to be noted that the adjustment part 76 is shown maintained to the coupling assembly 20 only by the magnetic attraction of the disk 106 by the magnet 70. However, supplemental retaining means (not shown) could be added.

An advantage of the coupling assembly 20 is that it is not necessary to remove the rollers from the conveyor nor to remove the coupling assemblies from the conveyor to adjust the friction force and therefore the maximum torque that can be applied to the rollers before slippage.

Even though the axially movable element is shown mounted to the driving portion, one skilled in the art would be in a position to design a coupling assembly according to the teaching of the present invention where the axially movable element is mounted to the driven portion.

Turning now to FIGS. 9 to 12 of the appended drawings, a conveyor 200 provided with coupling assemblies 202 according to a second embodiment of the present invention will be described.

Since the conveyor 200 is very similar to the conveyor 20 of FIGS. 1–8, it will not be described in detail hereinbelow, for concision purposes. The conveyor still includes side rails 26 and 28 and braces 30.

Similarly, the coupling assembly 202 is very similar to the coupling assembly 22 in structure and in operation. Therefore, only the differences between these assemblies will be described hereinbelow.

More specifically, the coupling assembly 202 is identical to the coupling assembly 22 without an adjustment part 76. Indeed, as will be described hereinbelow, the conveyor 200 includes means to simultaneously modify the adjustment on a plurality of coupling assemblies 202.

The coupling assembly 202 also includes means to determine if the roller contacting element 78 is in rotation. More specifically, a sensor (for example a proximity sensor 204) is mounted to one of the braces 30 and faces the contacting element 78. A small metal piece (see numeral 206 in FIG. 4) is mounted in the pins 98 of the cover member 88 to be detected by the sensor 204. This information is sent to a controller (not shown) that energizes the electric motor (not shown) driving the driving portions 44 of the coupling assemblies. This information will indicate the state of each section of the conveyor 200.

Of course, other types of sensors could be used to determine the rotation of the cover member 78.

Turning now more specifically to FIG. 11, the conveyor 200 further includes an adjustment assembly 208 comprising a longitudinal element in the form of a longitudinal tube 210 having a rectangular cross-section and made of magnetic material (for example, steel), a cylinder 212 including a body 214 and a piston 216, a linking assembly 218 between the free end of the piston 216 and the tube 210, and a stopper 219.

The longitudinal tube 210 is so mounted to brackets 220 mounted to the rail 26 as to pivot about a pivot pin 222.

The stopper 219 is so mounted to the side rail 26 as to be axially movable via a rotation action thereon. Indeed the shaft of the stopper 219 is threaded and inserted in a threaded aperture of the rail 26.

The body 214 of the cylinder 212 is so mounted to the brace 30 via a bracket 224 as to pivot about a pivot pin 226

As will easily be understood by one skilled in the art, the links between the cylinder and the brace 30, the link between the cylinder 212 and the linking assembly 218 and the link between the linking assembly 218 and the longitudinal tube 210 allow the movements of the longitudinal tube from an engaged position (shown in FIG. 11) to a disengaged position (shown in FIG. 12), and vice-versa.

It will be appreciated by one skilled in the art that the position of the stopper 219 determines the distance between the tube 210 and the magnet (not shown) of the coupling assemblies and therefore the maximum torque that may be applied to the rollers 22.

Advantageously, the entire conveyor path is divided into sections each provided with a separate adjustment assembly 208 thereby allowing the controller (not shown) to independently place the conveyor section in a displacing mode where the assembly 208 is in the position of FIG. 11 or in a non-displacing mode where the assembly is in the position of FIG. 12. For example, when a sensor 204 indicates that an entire section of the conveyor is stopped, the controller may determine that it is better to place the section in a non displacing mode.

Of course, the longitudinal tube 210 could be replaced by other longitudinal element made of magnetic material such as, for example, a metallic bar having a T-shaped cross-sectional profile.

Another advantage of the conveyor 200 is that it is possible to adjust more than one coupling assembly 202 simultaneously by modifying the position of the stopper 219.

It is to be noted that one skilled in the art will readily understand that other means for transmitting rotational drive throughout the conveyor 20, can be used, for example, a driving belt.

Of course, even though the present invention is described with a magnet and an element made of magnetic material, it will be apparent to one skilled in the art that two magnets could be used or that the magnet and the element made of magnetic material could be interchanged. The term magnetic material refers to any material that is susceptible to a magnetic force, including magnets.

Although the present invention has been described hereinabove by way of preferred embodiments thereof, it can be modified, without departing from the spirit and nature of the subject invention as defined in the appended claims.

What is claimed is:

1. A magnetic coupling assembly to selectively couple a drive element of a longitudinal conveyor to at least one conveyor roller; said coupling assembly comprising:

a driving portion configured and sized to be mounted to the conveyor; said driving portion being so configured as to be rotatably driven about a rotation axis by the drive element of the conveyor;

a driven portion so linked to said driving portion as to rotate about said rotation axis; said driven portion including an external surface configured and sized to be brought in contact with at least one conveyor roller;

an axially movable element mounted to one of said driving and driven portions; said axially movable element being provided with a first friction surface; the other of said driving and driven portions including a second friction surface facing said first friction surface;

wherein one of said axially movable element and the other of said driving and driven portions is provided with a magnetic field generating element; the other of said axially movable element and the other of said driving and driven portions being provided with an element made of magnetic material; and wherein said first and second friction surfaces are brought into constant contact by a an adjustable magnetic force present between said magnetic field generating element and said element made of magnetic material, and wherein an increase or decrease in said magnetic force is translated into a corresponding increase or decrease in a frictional force between said first and second friction surfaces.

2. A magnetic coupling assembly as recited in claim 1, wherein said driven portion is rotatably mounted to said driving portion.

3. A magnetic coupling assembly as recited in claim 1, wherein said driving portion includes a body having a first end and a second end configured and sized to receive said axially movable element.

4. A magnetic coupling assembly as recited in claim 3, wherein said axially movable element includes a tubular portion mountable to said second end of said body; wherein a) said cross-sectional profile of said tubular portion corresponds to a cross-sectional profile of said second end, and b) said cross-sectional profiles are so configured as to allow said axially movable element to rotate when said body rotates.

5. A magnetic coupling as recited in claim 4, wherein said second portion of said body is generally cylindrical and provided with a ridge and wherein said tubular portion of said axially movable element is cylindrical and provided with one channel corresponding to said ridge.

6. A magnetic coupling assembly as recited in claim 3, wherein said first end of said body is rotatably mounted to a fastener via bearings; said fastener being mountable to the conveyor.

7. A magnetic coupling assembly as recited in claim 6, wherein said first end of said body includes a sprocket that is engageable by the drive element of the conveyor.

8. A magnetic coupling assembly as recited in claim 2, wherein said driven portion includes a covering part and an adjustment part.

9. A magnetic coupling assembly as recited in claim 8, wherein said covering part is rotatably mounted to said driving portion via a bearing.

10. A magnetic coupling assembly as recited in claim 8, wherein said covering part includes said second friction surface and said external surface to be brought in contact with said at least one conveyor roller.

11. A magnetic coupling assembly as recited in claim 10, wherein said external surface to be brought in contact with said at least one conveyor roller includes a friction element to frictionally engage said at least one conveyor roller.

12. A magnetic coupling assembly as recited in claim 11, wherein said external surface includes at least one channel and wherein said friction element includes at least one O-ring mounted in said channel to frictionally engage the at least one conveyor roller.

13. A magnetic coupling assembly as recited in claim 8, wherein said adjustment part includes said element made of magnetic material and is so configured as to alternatively position said magnetic material element at predetermined distances from said covering part, to thereby vary the magnetic force present between said magnetic field generating element and said element made of magnetic material.

14. A magnetic coupling assembly as recited in claim 13, wherein said adjustment part includes legs and wherein said covering part includes corresponding indentations having different depth.

* * * * *